United States Patent
Koyama

(10) Patent No.: US 6,576,913 B2
(45) Date of Patent: Jun. 10, 2003

(54) FOCUSED ION BEAM APPARATUS HAVING A GAS INJECTOR IN WHICH ONE OF A PLURALITY OF NOZZLES CAN BE SELECTIVELY DRIVEN FOR ELEVATION

(75) Inventor: Yoshihiro Koyama, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 10/140,710

(22) Filed: May 8, 2002

(65) Prior Publication Data

US 2002/0171050 A1 Nov. 21, 2002

(30) Foreign Application Priority Data

May 17, 2001 (JP) .......................................... 2001-147917

(51) Int. Cl.$^7$ ................................................. H01J 37/08
(52) U.S. Cl. .................. 250/492.21; 118/726; 118/715; 239/412; 239/417
(58) Field of Search ...................... 250/492.21; 118/715, 118/726, 730, 723 FI; 401/31, 29, 30; 239/412, 417

(56) References Cited

U.S. PATENT DOCUMENTS

| | | | | |
|---|---|---|---|---|
| 3,989,389 A | * | 11/1976 | Hashimoto et al. ........... | 401/30 |
| 4,874,459 A | * | 10/1989 | Coldren et al. ................. | 438/9 |
| 4,874,460 A | * | 10/1989 | Nakagawa et al. ............ | 216/61 |
| 4,976,843 A | * | 12/1990 | Ward et al. ............ | 204/298.36 |
| 5,054,689 A | * | 10/1991 | Hunerberg et al. ......... | 239/412 |
| 5,435,850 A | * | 7/1995 | Rasmussen ................. | 118/726 |
| 5,549,403 A | * | 8/1996 | O'Shell ....................... | 401/31 |
| 6,328,221 B1 | * | 12/2001 | Moore et al. .................. | 239/1 |
| 6,365,905 B1 | * | 4/2002 | Koyama et al. ........ | 118/723 FI |

* cited by examiner

Primary Examiner—John R. Lee
Assistant Examiner—Paul Gurzo
(74) Attorney, Agent, or Firm—Adams & Wilks

(57) ABSTRACT

A focused ion beam apparatus has a gas injector provided with a plurality of gas supply pipes each having a nozzle at one end for ejecting a gas and a housing in which the plurality of gas supply pipes are slidably accommodated. The housing has a tip portion with a hole provided at a terminal end thereof and the hole has a size set so that only one of the nozzles can extend therefrom. In addition, the housing has a tapered nozzle guide portion for guiding a selected nozzle from a retracted position at which the selected nozzle does not extend from the hole to an extended position at which the selected nozzle extends from the hole.

13 Claims, 4 Drawing Sheets

BUNDLED NOZZLES

NOZZLES ARRANGED IN A ROW

3 ION OPTICAL SYSTEM
  CONDENSER LENS
  BEAM BLANKER
  ALIGNER
  APERTURE
  OBJECTIVE LENS

VARIOUS CONTROL SIGNALS
  ACCELERATION VOLTAGE
  ION OPTICAL SYSTEM
  DEFLECTION SCAN
  GAS SUPPLY
  SAMPLE STAGE DRIVE

FOCUSED ION BEAM APPARATUS HAVING A GAS INJECTOR IN WHICH ONE OF A PLURALITY OF NOZZLES CAN BE SELECTIVELY DRIVEN FOR ELEVATION

BACKGROUND OF THE INVENTION

The present invention relates to a technique for improving a gas injector used in a focused ion beam apparatus.

There are a variety of applications of focused ion beam apparatuses including acquisition of a microscopic image of a sample which is carried out by scanning an ion beam on the sample to detect secondary charged particles emitted from a surface of the sample, analysis based on components thus detected, a sputter etching process utilizing irradiation with ion beams, and a deposition process in which a deposition layer is formed on a surface by irradiating to the surface with ion beams while spraying a material gas on the same. Referring particularly to focused ion beam processes, ion beams are radiated to a surface of a sample while spraying a gas on the same not only in deposition processes but also in etching processes such as gas-assisted etching.

FIG. 4 shows a major configuration of a focused ion beam apparatus for performing such an ion beam process. An ion beam 2 focused through an ion optical system 3 is appropriately deflected by a deflector 4 to irradiate a surface of a sample 9 placed on a sample stage 7. When the ion beam 2 irradiates the sample surface, secondary charged particles are driven out from the sample surface, and said secondary charged particles depend on a sample substance located in the region irradiated with the ion beam 2. The secondary charged particles driven out as a result of the irradiation with an ion beam are captured by a detector 5 which detects the amount of the charged particles of interest. The value is digitized by an A-D converter and stored in a storage section of a computer 10 as data of the region irradiated with the beam. When the computer 10 designates a predetermined region to be scanned by a beam, a deflection voltage is applied to said deflector 4 through a driving system such that the ion beam 2 is scanned in said region. A scan image of the region designated by a computer 8 is obtained when a detected value of secondary charged particles at each beam spot is stored along with position information based on such a scan, and the image can be displayed on a display 11 as needed. An operation of etching a patterned film is performed through application of an appropriate deflection voltage to said deflector 4 by the computer 10 through a driving system to irradiate the region to be processed with an ion beam based on setting from an input operation section 12. Referring to a process of forming a patterned film on a substrate, the computer 10 sprays a vapor of an organic compound or the like on a predetermined region to be patterned with a gas injector 6 through a driving system based on setting from the input operation section 12 and applies an appropriate deflection voltage to said deflector 4 through a driving system to process said region by irradiating the same with an ion beam 2.

Referring to a basic configuration of the focused ion beam apparatus, the gas injector 6 and the secondary charged particle detector 5 are provided in the vicinity of a region which is irradiated with an ion beam 2. It is not essential to provide only one gas injector, and a plurality of gas injectors may be provided for processes which require an assist gas for etching, a material gas for forming a protective film, or a material gas for forming a coating layer or conductive path. When plural kinds of gasses are used, however, the gasses may stick to and remain on inner walls when a single nozzle and a single path are used to spray the gas and may be mixed with gas components previously used when the gas types are switched, which can cancel the effects of the gasses (etching and deposition). It is therefore necessary to provide plural kinds of nozzles and paths to use plural kinds of gasses. In conventional modes, (1) a plurality of gas injectors are separately provided as shown in FIG. 3A; (2) a plurality of nozzles are combined and driven together as shown in FIG. 3B; or (3) nozzles are arranged in a row and driven together as shown in FIG. 3C. The mode (1) in which gas injectors are treated separately has a space-related problem in that a great space is occupied and, in the modes (2) and (3) in which there is a plurality of gas injector nozzles, the bundle of nozzles becomes too thick, which not only makes it difficult to move the bundle down for use and to move it up for a rest but also makes it impossible to properly move the nozzles toward a beam-irradiated position on a sample. Further, since the distance between the irradiated position and the nozzle position is different from nozzle to nozzle, it is difficult to perform adjustments such as a gas flow amount adjustment for allowing the gasses to demonstrate their effects.

Further, when a sample is irradiated with charged ion beams, a charging phenomenon or so-called charge-up occurs as the irradiation time elapses. Since such a charging phenomenon on a sample surface can affect the emission of secondary charged particles and control of an ion-beam-irradiated position, it is an important problem in the focused ion beam apparatus to prevent such charging. A frequently used means for preventing such charging is to provide an electron injector in the vicinity of a region which is irradiated with an ion beam to neutralize the same through the application of an electron shower. As thus described, the neighborhood of an irradiated region is over-populated by members to be provided, and it is a problem in designing how to adopt and provide them.

It is an object of the invention to provide a gas injector in which a nozzle end section does not become too thick even if a plurality of nozzles are used to allow the nozzles to be smoothly moved down for use and moved up for a rest and to allow the nozzles to properly approach a beam-irradiated position on a sample and in which it is possible to overcome difficulties in a gas flow amount adjustment attributable to the distance between the irradiated position and nozzle position that is different from nozzle to nozzle.

SUMMARY OF THE INVENTION

In a gas injector according to the invention, a forward section of the same is formed by a cylindrical portion which collectively contains and holds a plurality of nozzles and gas supply pipes and a nozzle guide portion which has an opening of a size to allow only one of the nozzles to protrude outwardly at an end thereof and which is formed like a taper extending from said cylindrical portion to said opening, and a rear section of the gas injector has a mechanism capable of selectively driving said plurality of nozzles for elevation through said gas supply pipes.

Description of Reference Symbols

2: focused ion beam
6: gas injector
S: semiconductor device
P1, P2: patterns in a device
T: gas supply pipe
Y: hole
Tf: flexible pipe
I: insulation film
G: nozzle guide portion
C: conductor
GO: opening
N ($N_1$, $N_2$, $N_3$): nozzle

DETAILED DESCRIPTION OF THE INVENTION

Figure 1A:
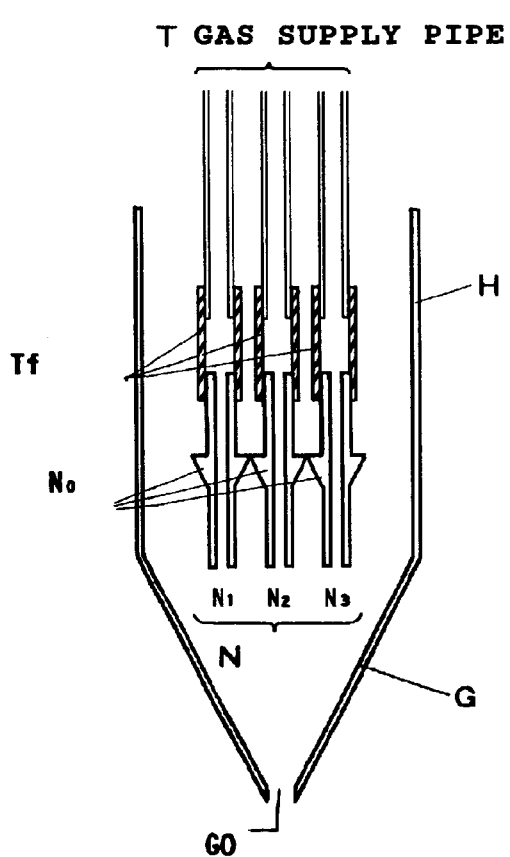
FIGS. 1A and 1B are illustrations explaining an operation of a gas injector which selectively uses a plurality of nozzles according to the invention.
Figure 1B:
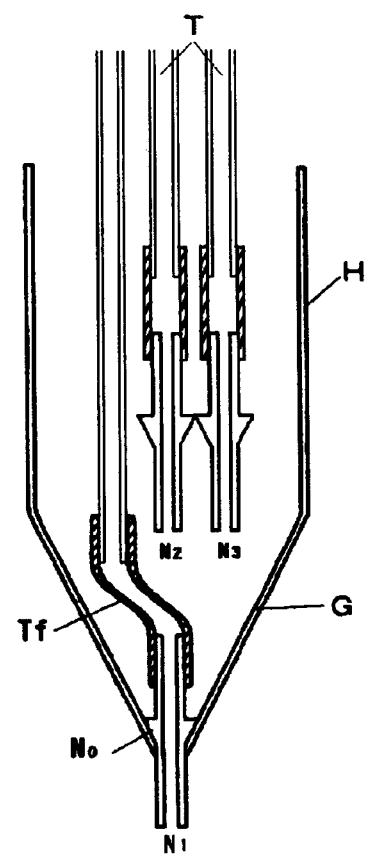

The present invention confronts problems in processes utilizing a focused ion beam apparatus in which gas-assisted etching or deposition while spraying a plurality of gases is frequently performed, the problems arising in that a great space occupied in an ion-beam-irradiated position due to presence of a mixture of various members in the case of a conventional mode in which a separate gas injector is provided for each; a bundle of nozzles becomes too thick not only to make it difficult to move the bundle down for use and to move it up for a rest but also to make it impossible to properly move the nozzles toward a beam-irradiated position on a sample in a mode in which a plurality of nozzles are combined or arranged in a row; and a gas flow amount adjustment becomes difficult because of the distance between the irradiated position and nozzle position which is different from nozzle to nozzle. A mechanism was conceived which allows only a nozzle for a gas to be used to be moved up and down and which keeps all nozzles in the same nozzle end position relative to a sample surface when they are moved down. For this purpose, as a mechanism to keep all of nozzles for unused gasses in an up position and to guide the end of a nozzle which is moved down to a predetermined position with a guide member, a forward section of a gas injector is formed by a cylindrical portion H which collectively contains and holds a plurality of nozzles N and gas supply pipes T and a nozzle guide portion G which has an opening GO of a size to allow only one of the nozzles N to protrude outwardly at an end thereof and which is formed like a taper extending from said cylindrical portion to said opening GO as shown in FIGS. 1A and 1B, and a mechanism (not shown) capable of selectively driving said plurality of nozzles N back and forth through said gas supply pipes T is provided at a rear section of the gas injector 6. The driving mechanism for elevation employs cylinder driving utilizing compressed air in which air is supplied to a particular selected cylinder to cause a plunger to slide back and forth in the cylinder. A gas supply pipe T is connected to the plunger and, when said plunger is urged, the gas supply pipe T connected thereto is pushed out as shown in B of the figure, which causes a nozzle N at another end to be guided to the nozzle guide portion G formed in a tapered configuration and to cause the end of the same to protrude from the hole at the opening GO. An engaging section N1 is provided in the middle of the nozzle N, and it contacts and engages an inner surface of the guide portion in the vicinity of said opening when the nozzle end protrudes from the opening, thereby positioning the nozzle end. The opening GO at the end of the nozzle guide portion G formed in a tapered configuration is in a fixed position relative to the cylindrical portion H, and the gas supply pipe T for any of the nozzles N collectively contained in and held by said cylindrical portion H must be flexibly bent in order for the end of the nozzle to be protruded from the same opening GO and positioned when it is pushed out. For this purpose, according to the invention, parts of the gas supply pipes T are constituted by flexible pipes Tf. A preferable material for the flexible pipes Tf is a resin-based material which has both of rigidity for transmitting a force to push out the plungers to the nozzle portions N and flexibility to bend in the axial direction and which emits only a small amount of a mixture such as an out gas during use.

[Embodiment 1]

An embodiment of the invention will now be described along with an example of a change in wiring made in a device utilizing the same. The example is a gas injector capable of supplying three kinds of gasses as shown in FIG. 1A in which three nozzles $N_1$, $N_2$, and $N_3$ and gas supply pipes T are collectively contained in a cylindrical portion H. Teflon tubes Tf are interposed between the gas supply pipes T connected to plungers which are not shown and the nozzles N at the end to maintain flexibility of the gas supply pipes. The nozzles N and gas supply pipes T are made of stainless steel, and the nozzles have an inner diameter of 0.2 mm and an outer diameter of 0.5 mm. An opening GO at the end of a nozzle guide portion G formed in a tapered configuration has a diameter of 0.5 mm which is equal to the nozzle outer diameter, and the nozzle guide portion G is made of stainless steel. Copper may be used instead, and hastelloy may be used when corrosion resistance is required. The material is selected in consideration to workability, thermal conductivity, corrosion resistance, and so on. Cylinders are driven by air and are provided outside a chamber along with gas sources. FIG. 1A shows a state in which all of the nozzles are in an up position, and FIG. 1B shows a state in which the nozzle $N_1$ among them is placed in a down position to spray a gas.

Figure 2:
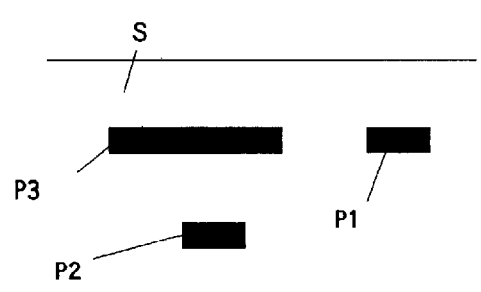
FIGS. 2A–2E are illustrations explaining steps for changing wiring of a semiconductor device using a focused ion beam apparatus having the gas injector according to the invention.
Figure 2:
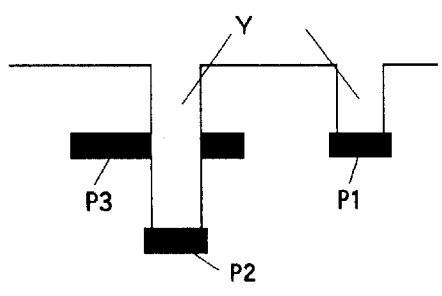
Figure 2:
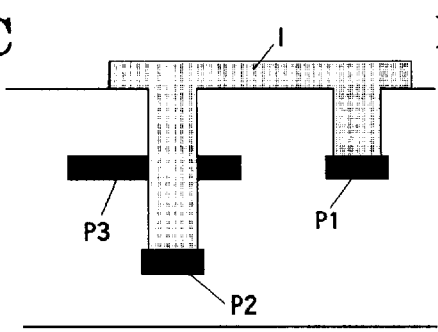
Figure 2:
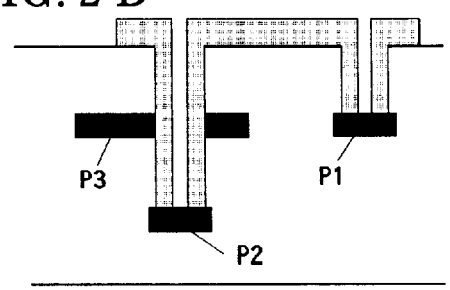
Figure 2:
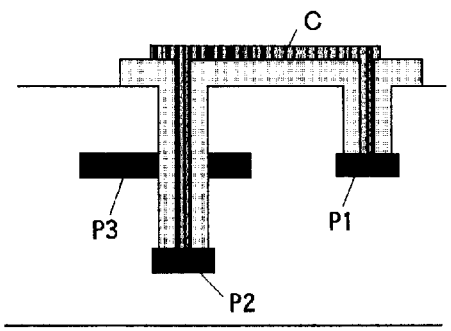
Figure 3:
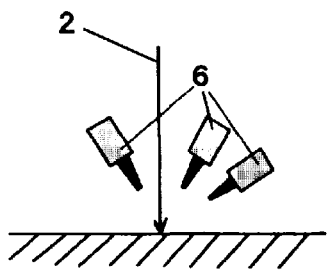
FIGS. 3A–3C are illustrations explaining modes of conventional gas injectors for blasting plural kinds of gases in a focused ion beam apparatus.
Figure 3:
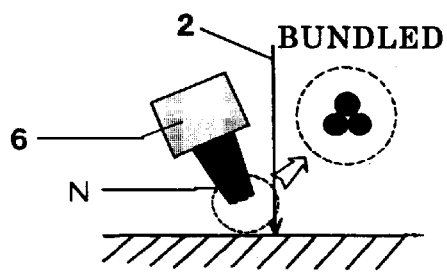
Figure 3:
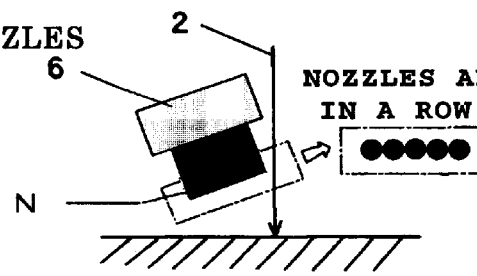
Figure 4:
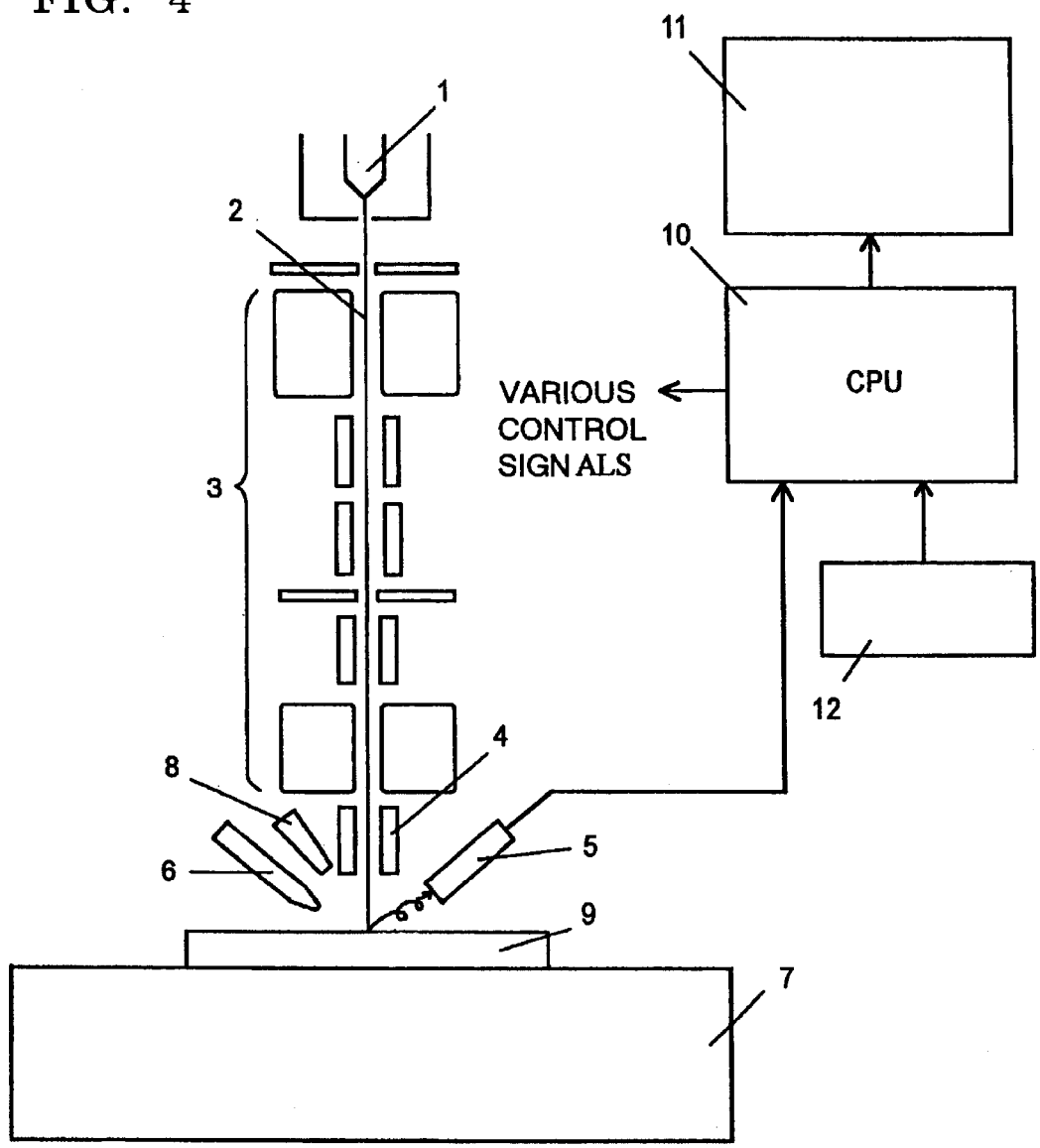
FIG. 4 is an illustration showing a basic configuration of a focused ion beam.

The gas injector is provided in the vicinity of a region irradiated with a beam from a focused ion beam apparatus to perform a wiring process on a device. Let us assume that a process is to be performed to connect a pattern P1 and a pattern P2 in a semiconductor device S with a conductor as shown in FIG. 2A. It is however desired to keep them out of continuity to a pattern P3.

Step 1: A process is first performed to drill a hole from a surface of the device toward the patterns P1 and P2 and, at this time, the hole extending to the pattern P2 penetrates through the pattern P3 because of the complicatedness of the device. One of the gasses supplied by the gas injector is a xenon fluoride, and said xenon fluoride is selected to drive the relevant cylinder, thereby causing the nozzle $N_1$ to protrude from the opening GO at the end of the nozzle guide portion G. An ion beam is radiated with the gas blasted in this state to perform gas-assisted etching, thereby drilling a hole extending from the surface of the device to the patterns P1 and P2. When such a thin and deep hole is formed, since the material scattered on the circumferential wall of the hole sticks thereto if simple sputter etching is employed, the process must be performed through gas-assisted etching in which the material is vaporized and eliminated as a result of a reaction with the gas. The first step is terminated when a hole is drilled from the surface of the device to the patterns P1 and P2 as shown in B of the figure.

Second Step: An insulation film I is formed through deposition on the circumferential surface of the hole and a surface of the device in the vicinity of the same as shown in C of the figure. A mixed gas of tetraethoxysilane and oxygen or water is used as a material gas for this process. The nozzle $N_1$ to which xenon fluoride has been supplied as described above is moved up, and the nozzle $N_2$ to which the mixed gas of tetraethoxysilane and oxygen or water is to be supplied is moved down instead and protruded from the opening GO at the end of the nozzle guide portion G. When an ion beam is radiated while spraying said gas, the hole is filled with an insulator ($SiO_2$) I, and a film is deposited and formed on the surface of the sample as shown in C of the figure.

Third Step: The hole which has been refilled with the insulator I is drilled again through gas-assisted etching as shown in D of the figure. At this time, the process is performed to leave an insulation film on the sidewall of the hole. Especially, it is important to prevent the pattern P3 from being exposed.

Fourth Step: A process then follows to connect the patterns P1 and P2 with a conductor C, and it is performed through deposition utilizing hexacarbonyltungsten supplied as a material gas from the gas injector. Therefore, the nozzle $N_2$ supplied with the mixed gas of tetraethoxysilane and oxygen or water is moved up, and the nozzle $N_3$ supplied with hexacarbonyltungsten is moved down. Then, an ion beam is radiated with the same gas sprayed to fill each hole through deposition and to provide a film in the neighborhood between the holes, thereby forming a conductive path made of tungsten between the patterns P1 and P2 as shown in E of the figure. The pattern P3 is still kept out of continuity.

As described above, when a focused ion beam apparatus having a gas injector capable of selectively blasting plural kinds of gases is used, it is possible to perform a series of operations requiring three kinds of gasses to be blasted, i.e., gas-assisted etching for drilling, deposition for coating with an insulation film, and deposition for forming a conductive path sequentially as a continuous operation without a need for operations such as replacement of gases and cleaning of the nozzles, which not only reduces work loads but also significantly reduces the working time. While the above embodiment has referred to an example in which a xenon fluoride, a mixed gas of tetraethoxysilane and oxygen or water, and hexacarbonyltungsten are respectively used as an assist gas for etching, a gas for deposition of an insulator, and a gas for deposition of a conductor, alternatively and generally, a halogen-type gas such as iodine or chlorine may be used as an etching assist gas; an organic metal compound including a metal such as copper or molybdenum may be used as a deposition gas for forming a conductive film; and a silicon-compound-type gas including oxygen such as tetramethylcyclotetrasiloxane may be used as a gas for deposition of an insulator.

In a gas injector of a focused ion beam apparatus according to the invention, a forward section of the same is formed by a cylindrical portion which collectively contains and holds a plurality of nozzles and gas supply pipes and a nozzle guide portion which has an opening of a size to allow only one of the nozzles to protrude outwardly at an end thereof and which is formed like a taper extending from said cylindrical portion to said opening, a rear section of the same has a mechanism capable of selectively driving said plurality of nozzles for elevation through said gas supply pipes. Therefore, different gases will not be mixed with each other when blasted, which makes it possible to perform an operation as intended. Since the positions of nozzles for supplying different kinds of gases are uniquely determined when the gases are blasted, an adequate distance can be maintained between the nozzles and a sample surface, and gas concentrations can be easily adjusted.

Further, since parts of the gas supply pipes of the gas injector of a focused ion beam apparatus according to the invention are formed by flexible members, said nozzles can be guided by the guide portion in a tapered configuration to be smoothly protruded from the opening at the end. Since an engaging section is provided in the middle of a nozzle so as to contact an inner surface of the guide portion in the vicinity of said opening when the nozzle end protrudes from the opening at the end of the tapered guide portion, a stable positional relationship is maintained between the nozzle end and a sample surface, and any different gas leaking from another nozzle will not leak from the opening at the end because said engaging section abuts the guide surface.

What is claimed is:

1. A focused ion beam apparatus having a gas injector, the gas injector comprising: a plurality of gas supply pipes each terminating in a nozzle for ejecting a gas; a cylindrical member for slidably collectively containing the plurality of nozzles and gas supply pipes and having a tapered nozzle guide portion which has an opening with a size sufficient to allow only one of the nozzles to protrude outwardly at an end thereof, the nozzle guide portion extending from the cylindrical portion to the opening and having a tapered profile; and a mechanism for selectively driving the plurality of nozzles for elevation through the gas supply pipes.

2. A focused ion beam apparatus according to claim 1; wherein the gas supply pipes each comprise solid inflexible pipes connected by a flexible member such that the respective gas supply pipes can be guided through the tapered guide portion to allow the respective nozzles to smoothly protrude from the opening at the end thereof.

3. A focused ion beam apparatus according to claim 2; wherein each of the nozzles is provided with an engaging portion which contacts an inner surface of the tapered guide portion in the vicinity of the opening when a respective nozzle protrudes from the opening at the end of the tapered guide portion.

4. A focused ion beam apparatus according to claim 2; wherein the solid inflexible pipes are formed of stainless steel and the flexible portion is formed of Teflon.

5. A focused ion beam apparatus according to claim 1; wherein each of the nozzles is provided with an engaging portion which contacts an inner surface of the tapered guide portion in the vicinity of the opening when a respective nozzle protrudes from the opening at the end of the tapered guide portion.

6. A focused ion beam apparatus having a gas injector, the gas injector comprising: a plurality of gas supply pipes each having a nozzle at one end; a cylindrical member for accommodating the gas supply pipes and having a tapered nozzle guide portion provided with an opening having a size sufficient to allow only one of the nozzles to protrude outwardly at an end thereof, the tapered nozzle guide portion extending from the cylindrical portion to the opening and having a tapered profile; and a driving mechanism for selectively driving a desired one of the nozzles to protrude out of the opening.

7. In a focused particle beam apparatus, a gas injector comprising: a plurality of gas supply pipes each having a nozzle at one end for ejecting a gas; and a housing in which the plurality of gas supply pipes are slidably accommodated, the housing having a tip portion with a hole provided at a terminal end thereof, the hole having a size set so that only one of the nozzles can extend therefrom, and having a tapered nozzle guide portion for guiding a selected nozzle from a retracted position at which the selected nozzle does not extend from the hole to an extended position at which the selected nozzle extends from the hole.

8. A focused particle beam apparatus according to claim 7; wherein the gas supply pipes each comprise solid inflexible pipes connected by a flexible member such that the respective gas supply pipes can be guided through the tapered nozzle guide portion to allow the respective nozzles to smoothly protrude from the opening at the end thereof.

9. A focused particle beam apparatus according to claim 8; wherein the solid inflexible pipes are formed of stainless steel.

10. A focused particle beam apparatus according to claim 8; wherein the flexible portion is formed of teflon.

11. A focused particle beam apparatus according to claim 7; wherein each of the nozzles is provided with an engaging portion which contacts an inner surface of the tapered nozzle guide portion in the vicinity of the opening when a respective nozzle protrudes from the opening at the end of the tapered nozzle guide portion.

12. A focused particle beam apparatus according to claim 7; wherein the housing has a substantially cylindrical shape.

13. A focused particle beam apparatus according to claim 7; wherein the tip portion has a tapered profile forming the tapered nozzle guide portion.

* * * * *